(12) United States Patent
Meagley et al.

(10) Patent No.: US 7,718,528 B2
(45) Date of Patent: May 18, 2010

(54) PHOTOACTIVE ADHESION PROMOTER IN A SLAM

(75) Inventors: Robert P. Meagley, Hillsboro, OR (US); Heidi B. Cao, Portland, OR (US); Kevin P. O'Brien, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 367 days.

(21) Appl. No.: 11/620,516

(22) Filed: Jan. 5, 2007

(65) Prior Publication Data

US 2007/0105383 A1    May 10, 2007

(51) Int. Cl.
*H01L 21/302* (2006.01)
(52) U.S. Cl. .............. 438/636; 438/496; 438/700; 438/703
(58) Field of Classification Search .......... 438/636, 438/496, 796, 700, 703
See application file for complete search history.

(56) References Cited

U.S. PATENT DOCUMENTS

| | | | |
|---|---|---|---|
| 5,185,234 A | 2/1993 | Nakatsukasa et al. | 430/284.1 |
| 5,310,581 A | 5/1994 | Schmidt et al. | 427/558 |
| 6,872,513 B2 | 3/2005 | Meagley | 430/324 |
| 6,876,017 B2 * | 4/2005 | Goodner | 257/254 |
| 6,890,448 B2 | 5/2005 | Pavelchek | 216/16 |
| 6,991,893 B2 | 1/2006 | Goodner et al. | 430/322 |
| 7,157,755 B2 | 1/2007 | Goodner | 257/254 |
| 7,270,933 B2 * | 9/2007 | Jung | 430/270.1 |
| 2004/0086800 A1 * | 5/2004 | Meagley | 430/270.1 |
| 2004/0265733 A1 | 12/2004 | Houlihan et al. | 430/270.1 |
| 2004/0265754 A1 | 12/2004 | Barclay et al. | 430/322 |
| 2005/0014096 A1 | 1/2005 | Meagley | 430/270.1 |
| 2005/0014876 A1 * | 1/2005 | Fujita et al. | 524/155 |
| 2005/0079701 A1 * | 4/2005 | Baks et al. | 438/622 |
| 2005/0142855 A1 * | 6/2005 | Choi | 438/637 |
| 2005/0212135 A1 * | 9/2005 | Wu et al. | 257/758 |
| 2005/0221218 A1 | 10/2005 | Clark et al. | 430/270.1 |
| 2006/0173115 A1 * | 8/2006 | Fudemoto et al. | 524/445 |
| 2007/0012950 A1 | 1/2007 | Cain et al. | 257/194 |

FOREIGN PATENT DOCUMENTS

WO    WO2005022664    10/2005

* cited by examiner

*Primary Examiner*—Kimberly D Nguyen
*Assistant Examiner*—Maria Ligai
(74) *Attorney, Agent, or Firm*—Michael D. Plimier

(57) ABSTRACT

A semiconductor process technique to help reduce semiconductor process effects, such as undesired line edge roughness, insufficient lithographical resolution, and limited depth of focus problems associated with the removal of a photoresist layer. More particularly, embodiments of the invention use a photoacid generator (PAG) material in conjunction with a sacrificial light absorbing material (SLAM) to help reduce these and other undesired effects associated with the removal of photoresist in a semiconductor manufacturing process. Furthermore, embodiments of the invention allow a PAG to be applied in a semiconductor manufacturing process in an efficient manner, requiring fewer processing operations than typical prior art techniques.

9 Claims, 8 Drawing Sheets

PHOTOACTIVE ADHESION PROMOTER IN A SLAM

FIELD

Embodiments of the invention relate to the field of semiconductor manufacturing. More particularly, embodiments of the invention relate to a photoactive adhesion promoter to facilitate solubility of photoresist on a semiconductor wafer.

BACKGROUND

As feature sizes continue to decline in modern photolithographic semiconductor manufacturing processes, effects, such as undesired line edge roughness, insufficient lithographical resolution, and limited depth of focus problems can increase. More particularly, photoresist image footprints may become increasingly difficult to control as semiconductor device features become smaller and closer together.

Adhesion promoters may be used to bond the photoresist to the semiconductor substrate or other device surface until the photoresist is exposed to light, thereby defining feature edges and boundaries within the device. Photoresist, however, may persist around the substrate surface and photoresist interface. This is because some regions toward the bottom of the photoresist may not become sufficiently soluble after being exposed to an incident radiation to be completely removed, and instead remain bonded to the substrate by the adhesion promoter. These areas of persisting photoresist may correspond to areas where an incident radiation signal is weakest due to radiation absorption by photoresist or reflective interaction effects between the substrate and photoresist.

A prior art technique for addressing the shortcomings of traditional adhesion promoters is the use of a photoactive adhesion promoter. Photoactive adhesion promoters contain photoacid generators (PAGs), which react to incident light by releasing acid in regions in which the photoresist is exposed to the light. The acid helps to remove the photoresist from these regions, thereby improving the accuracy of features defined by the presence of photoresist.

FIG. 1 illustrates a prior art photoadhesion promoter moiety comprising a PAG. The prior art example of FIG. 1 illustrates a system that is capable of attaching a PAG material to a semiconductor wafer as a self-assembled layer. The photoactive adhesion promoter of FIG. 1 comprises an adhesion promoter and a PAG. The PAG comprises a photon harvesting group and a catalyst group. In the embodiment illustrated in FIG. 1, the adhesion promoter is trimethoxysilane, the photon harvesting group is methyldiphenylsulfonium, and the catalyst group is nonafluorobutanesulfonate. In addition, a linker bonds the adhesion promoter to the photon harvesting group.

The adhesion promoter, photon harvesting group, and the catalyst group may comprise different compounds as well. For example, the adhesion promoter may comprise alkoxysilane, silylchloride (a subclass of silylhalide), phosphate, phosphonate, alkene, thiol, or sulfide, The photon harvesting group may comprise sulfonium salts, such as triarylsulphonium. Triarylsulphonium is a general class, in which aryl represents any structure with an aromatic group bound to the sulfur atom as well as functionalized aryl groups where functionalization may be heteroatoms, such as fluorine, chlorine, bromine, and functional groups such as alcohol (OH), nitro ($NO_2$), amine ($R_3N$), amide ($R_2NC(O)R$), carboxylic acid (RCOOH), ester (RCOOR), ether (ROR), carbonate (ROC(O)OR).

Furthermore, alkyldiarylsulfonium and dialkylarylsulfonium are a general class of sulfonium salts which may be used, in which aryl is defined as above and alkyl is a hydrocarbon group, such as $(CH_2)_nCH_3$ where n=0 to 11, as well as functionalized hydrocarbon groups, in which functionalization may be heteroatoms, such as fluorine, oxygen, nitrogen, chlorine, bromine and functional groups such as alcohol (OH), nitro ($NO_2$), amine ($R_3N$), amide ($R_2NC(O)R$), carboxylic acid (RCOOH), ester(RCOOR), ether (ROR), or carbonate (ROC(O)OR). Alternatively, the photon harvesting group may comprise iodonium salts, such as diaryl and alkyaryl, in which aryl and alkyl are as defined above.

The catalyst group may comprise alternative compounds, such as perfluoroalkylsufonate, alkylsulfonate, arylsulfonate, perfluoroalkyl, alkyl and aryl phosphate, or fluoroalkylsulfonamide.

Other photoadhesion promoters include sulfides, nitroaryl derivatives, or aryl sulfates (for example, tosylates). PAGs may include sulfide and onium type compounds such as diphenyl iodide hexafluorophosphate, diphenyl iodide hexafluoroarsenate, diphenyl iodide hexafluoroantimonate, diphenyl p-methoxyphenyl triflate, diphenyl p-tert-butylphenyl triflate, diphenyl p-isobutylphenyl triflate, diphenyl p-tert-butylphenyl triflate, triphenylsulfonium hexafluorophosphate, triphenylsulfonium hexafluoroarsenate, triphenylsulfonium hexafluoroantimonate, bis-(t-butylphenyl)iodonium triflate, triphenylsulfonium triflate, triphenylsulfonium nonafluorobutylsulfonate, diphenyliodonium heptadecafluorooctylsulphonate, and dibutylnaphthysulfonium triflate, as well as the combinations and permutations of the above moieties.

Examples of photo-base generators (PBGS) may include nitrocarbamate or quaternary ammonium dithiocarbamate and other generators described in, for example, Prog. Polym. Sci., volume 21, 1-45 (1996 Elsevier Science, Ltd.) or in J. Polym. Sci. Part A: Polym. Chem., 39, 1329-1341 (2001).

Sacrificial light absorbing material (SLAM) is typically used to fill holes or trenches in the surface of various semiconductor material (e.g. substrate material) before subsequent processing layers are added. Furthermore, SLAM materials are useful in that they absorb incident light, thereby reducing the effect of sporadic photoresist destruction that can result from light reflected from the material exposed to the light. SLAM is typically spun on to a wafer material and later etched, leaving SLAM in the holes or trenches within the surface in order to create a relatively smooth surface.

FIG. 2 illustrates a prior art dual damascene process, in which a photoresist layer (including a PAG) and a SLAM layer are deposited on a semiconductor surface. A mask layer can be applied, exposing the photoresist layer to incident radiation (ultra-violet light, extreme ultra-violet light, electron beam, x-ray, etc.) in areas that are not covered by the mask layer, removing photoresist from the exposed areas.

Prior art processing techniques typically require at least two processing steps to apply a PAG (typically contained within the photoadhesion promoter of the photoresist) and a SLAM to the wafer. This is because the PAG is typically included in the photoresist, which is applied after the SLAM. Using extra process step or steps to apply PAG and SLAM to a wafer can be costly in terms of processing time and wafer yield, as these steps require time and serve as a potential source of defects within the process.

Furthermore, prior art semiconductor processing techniques, such as those used in a damascene process flow, typically require a bake step, in which the wafer can be heated to extreme temperatures. During a bake, the wafer and SLAM may become porous, allowing amines to be released from the silicon material in the wafer, which can get trapped within a superjacent ILD layer and/or migrate 'upward' to the photoresist layer.

FIG. 2 illustrates the migration path of amines released from the wafer that get trapped in the ILD and then migrate up to the photoresist layer. The amines trapped in the ILD can flow through the SLAM and react with an overlying photoresist layer, thereby deteriorating ("poisoning") the photoactive properties of the photoresist. Resist poisoning can result in a photoresist residue that cannot react with incident light, and therefore remains after the photoresist is developed, causing features within the semiconductor device to be deformed.

BRIEF DESCRIPTION OF THE DRAWINGS

Embodiments and the invention are illustrated by way of example and not limitation in the figures of the accompanying drawings, in which like references indicate similar elements and in which.

DETAILED DESCRIPTION

Embodiments of the invention described herein help reduce semiconductor process effects, such as undesired line edge roughness, insufficient lithographical resolution, and limited depth of focus problems associated with the removal of a photoresist layer. More particularly, embodiments of the invention use a photoacid generator (PAG) material in conjunction with a sacrificial light absorbing material (SLAM) to help reduce these and other undesired effects associated with the removal of photoresist in a semiconductor manufacturing process. Furthermore, embodiments of the invention allow a PAG to be applied in a semiconductor manufacturing process in an efficient manner, requiring fewer processing operations than typical prior art techniques.

In at least one embodiment of the invention, a SLAM material containing a PAG material is applied to a semiconductor surface. Excess SLAM/PAG material may then by removed from the surface, leaving SLAM/PAG within any holes or trenches created during the course of semiconductor processing within a semiconductor surface. The SLAM/PAG material that remains within the holes of the semiconductor surface helps to create a substantially smoother surface than without the use of the SLAM/PAG. The SLAM/PAG remaining in the holes and irregularities of the surface additionally contribute to a more anti-reflective surface, such that incident radiation used to develop the photoresist does not sporadically reflect from the surface to the surrounding photoresist.

The SLAM itself can absorb light, thereby helping to reduce the amount of incident light that is reflected from the surface to which the photoresist is being applied. PAG material releases an acid when exposed to incident light, thereby assisting in the removal of photoresist from the exposed regions. Including the PAG material within the SLAM, in one embodiment, helps to create more accurate features within the exposed regions vis-à-vis the acid released by the PAG material when exposed to incident light. Furthermore, because some embodiments of the invention combine SLAM and PAG material, only the process operations necessary to apply the SLAM material are necessary to apply the PAG material, thereby improving the efficiency of the process over the prior art.

Figure 1:
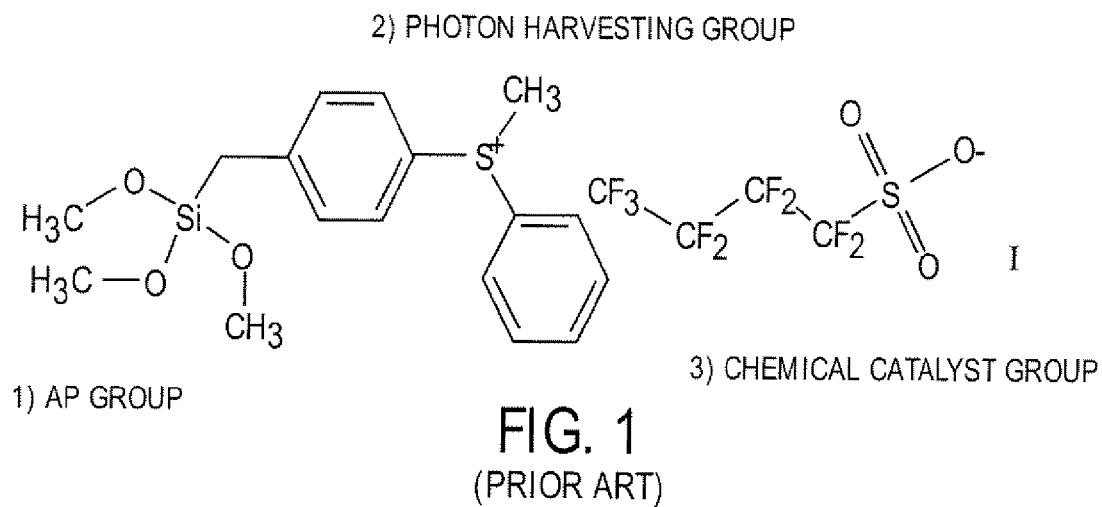
FIG. 1 illustrates a prior art photoactive adhesion generator (PAG) compound.
Figure 2:
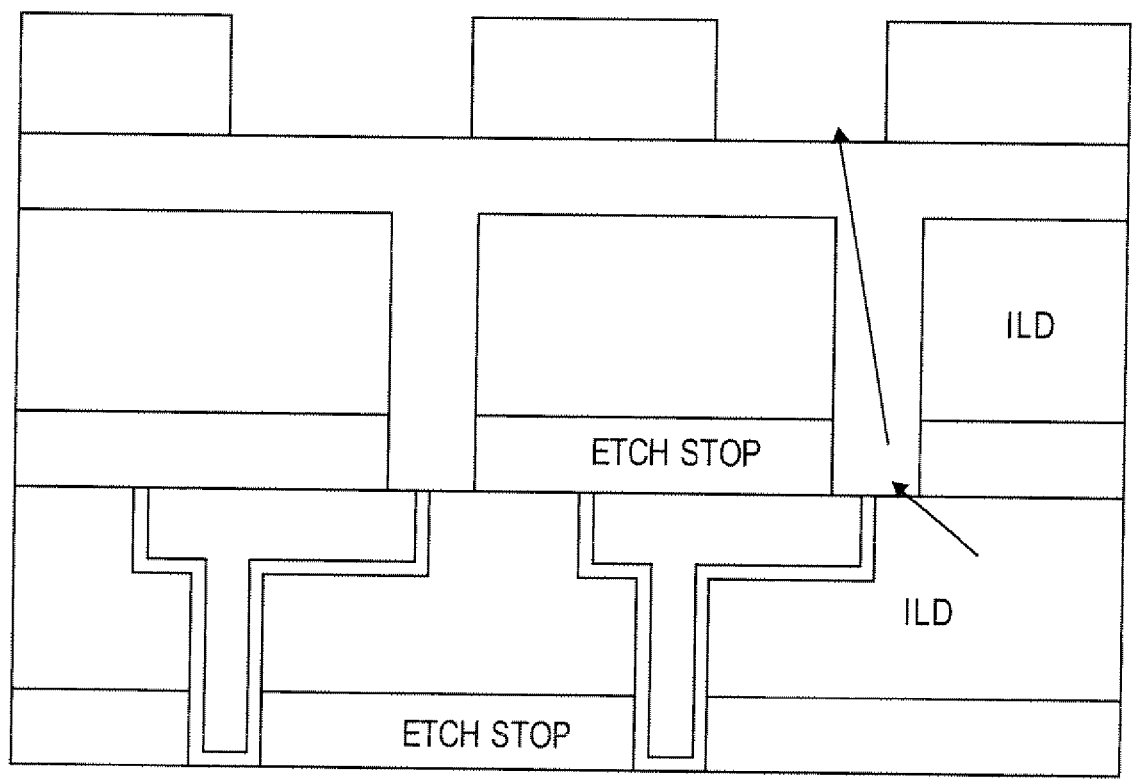
FIG. 2 illustrates a prior art damascene process in which a sacrificial light absorbing material (SLAM) is applied in a separate process step from the application of a PAG.
Figure 3:
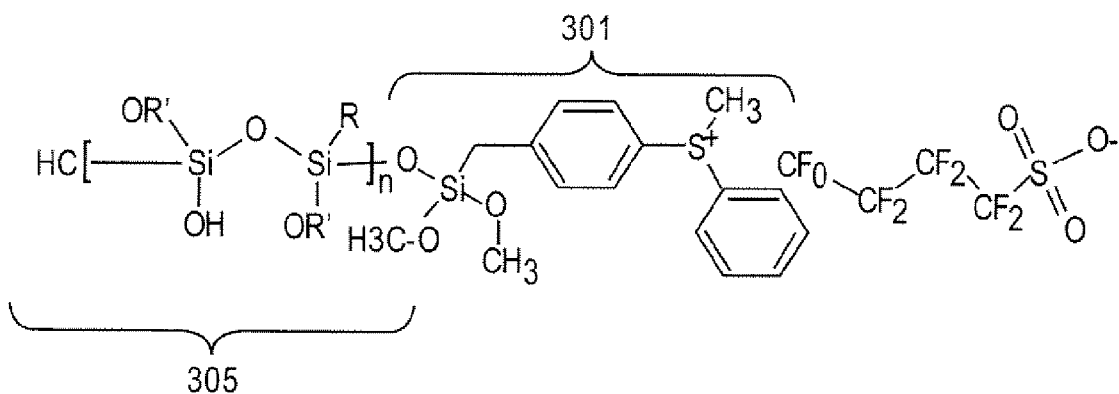
FIG. 3 illustrates a compound containing a PAG material and a SLAM material according to one embodiment of the invention.
Figure 9A:
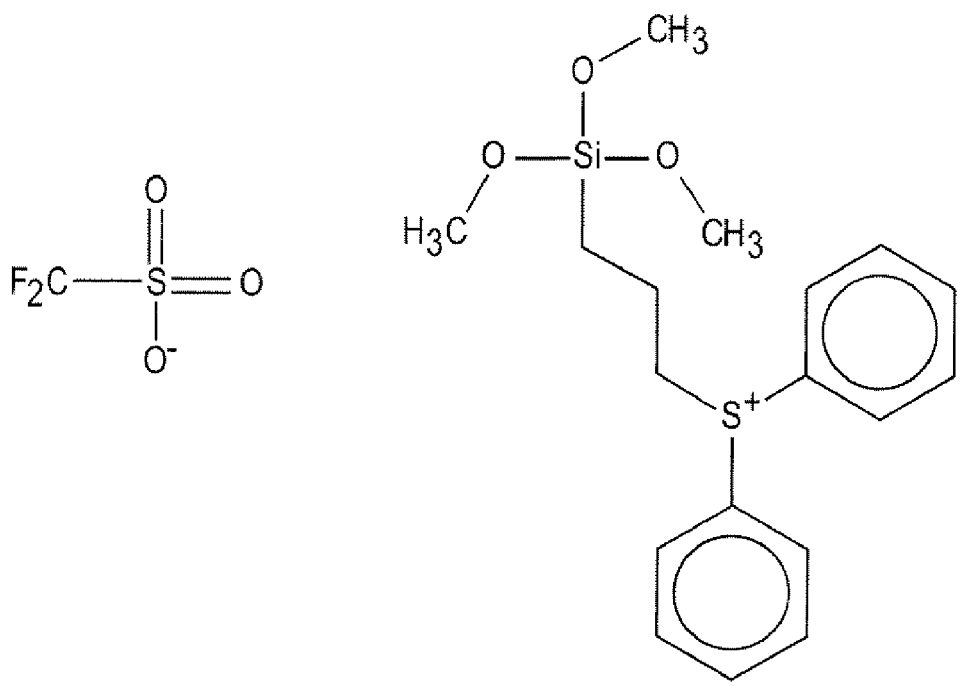
FIGS. 9a-9c illustrate monomers that may be included in the PAG.
Figure 9B:
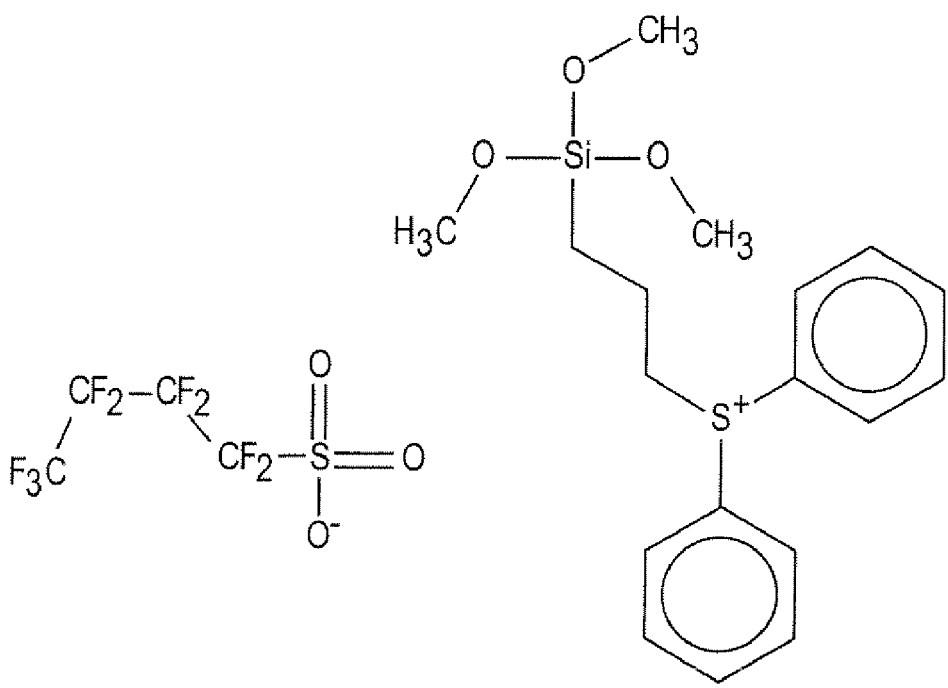
Figure 9C:
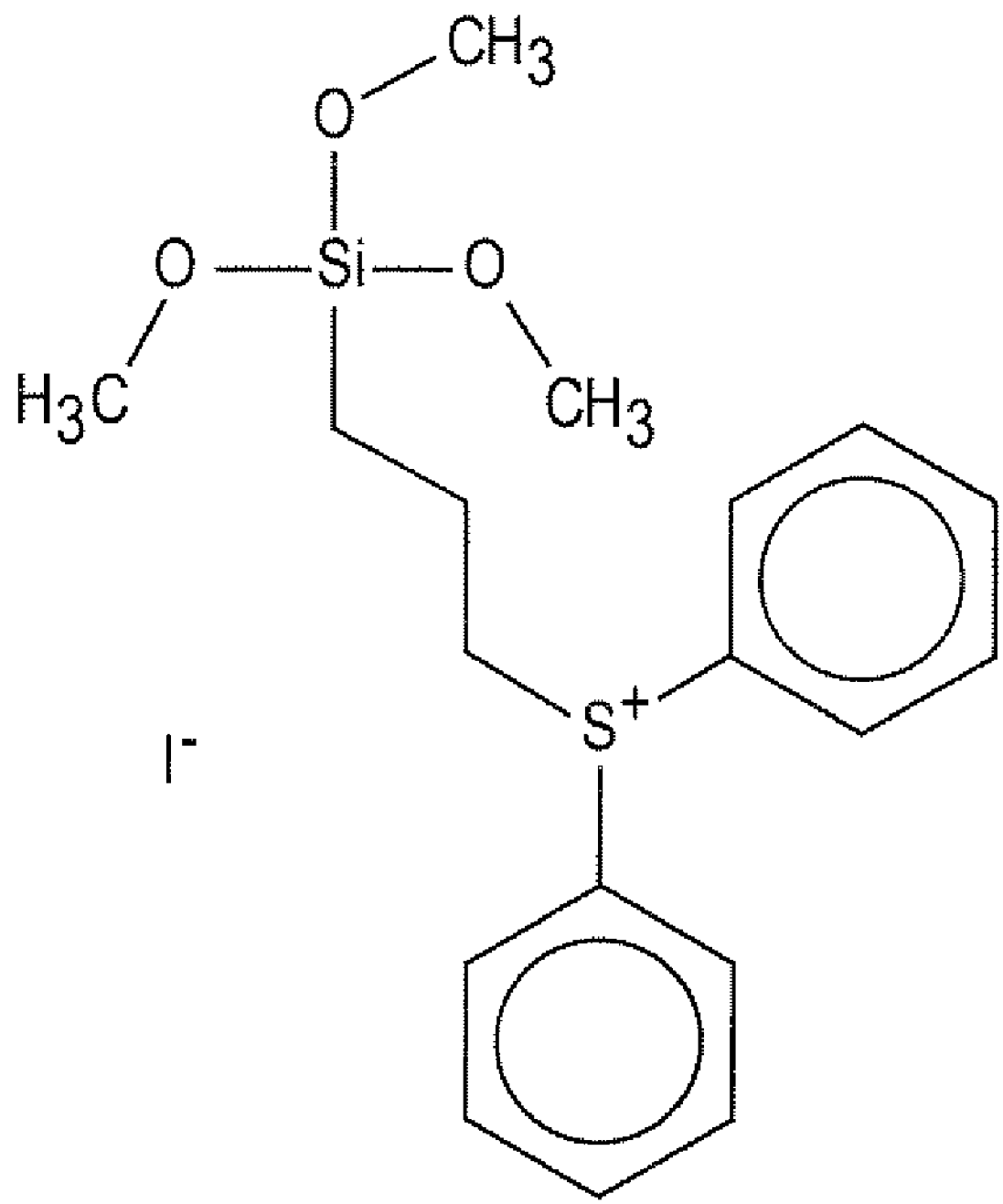

FIG. 3 illustrates a PAG 301, such as the one illustrated in FIG. 1, covalently bonded to a SLAM material 305, according to one embodiment of the invention. In one embodiment, the PAG is bound to the SLAM through a reaction of the trialkoxysilane with pendant groups (e.g. Si—OH groups) within the SLAM material, forming silylether linkages. In one embodiment the PAG is bound to the SLAM via covalent bonds that attach a light harvesting group and a catalyst (in this case a PAG) to the SLAM material. In other embodiments, an admixture of PAG and SLAM material would bind the PAG to the SLAM. In addition to the PAG material previously discussed, the PAG may include a monomer, such as (3-diphenylsulfoniumpropyl) trimethoxysilane trifluoromethanesulfonate (see FIG. 9a), (3-diphenylsulfoniumpropyl) trimethoxysilane nonafluorobutanesulfonate (see FIG. 9b), 3-diphenylsulfoniumpropyl) trimethoxysilane iodide (see FIG. 9c).

Other embodiments may involve other reactions, depending upon various patterning and resist requirements. For example, in one embodiment, a photobase is used instead of or in addition to the PAG, which would have an opposite effect upon the photoresist-wafer interface than using a PAG alone. Furthermore, in other embodiments, a combination of photobase and photoacid sensitivity would allow further control of the photoresist profile, including reduction of footing and line edge roughness, such as in the bottom of trench patterns and contact patterns, as well as substrate compatibility. In other embodiments, the PAG and/or photobase may be blended with other compounds to provide further control of photoresist removal.

Figure 4:
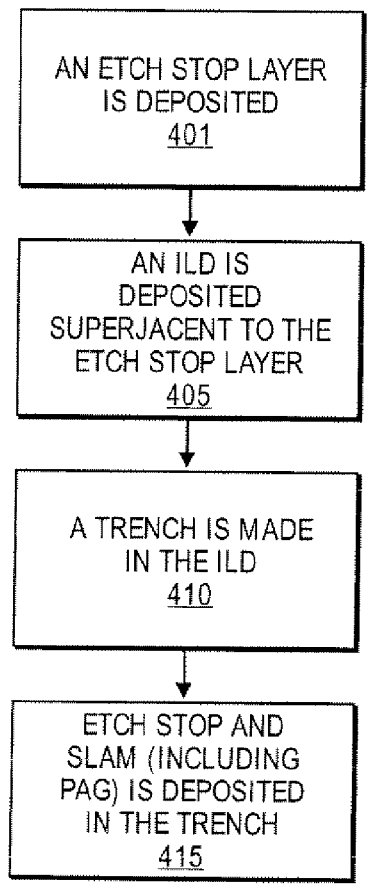
FIG. 4 illustrates a process for forming a photoactive adhesion promoter and a photoresist layer on a semiconductor substrate according to one embodiment of the invention.

FIG. 4 illustrates a process in which a SLAM/PAG material is formed in a semiconductor device according to one embodiment of the invention. At operation 401, an etch stop layer is deposited, and at operation 405, an ILD is deposited superjacent to the etch stop layer. At operation 410, a trench is made in the ILD and etch stop and SLAM (including PAG) is deposited in the trench at operation 415. In other embodiments, there may be more operations involved to perform other processing steps, such as deposition of photoresist, development of photoresist, etc. However, embodiments of the invention deposit a PAG in the same processing operation as the SLAM deposition.

In addition to amines released from the wafer and interlayer dielectric (ILD) as a result of a bake process, amines may also be generated in some embodiments of the invention by introducing a PAG within a SLAM. Accordingly, some embodiments of the invention reduce photoresist poisoning that can result from amines reacting with the photoresist layer by including a poison buffer layer (PBL). In one embodiment, a PBL is deposited between the SLAM layer (including a PAG) and a photoresist layer in order to substantially prevent amines released during a high-temperature bake operation, or otherwise, from coming into contact with the photoresist layer.

Figure 5:
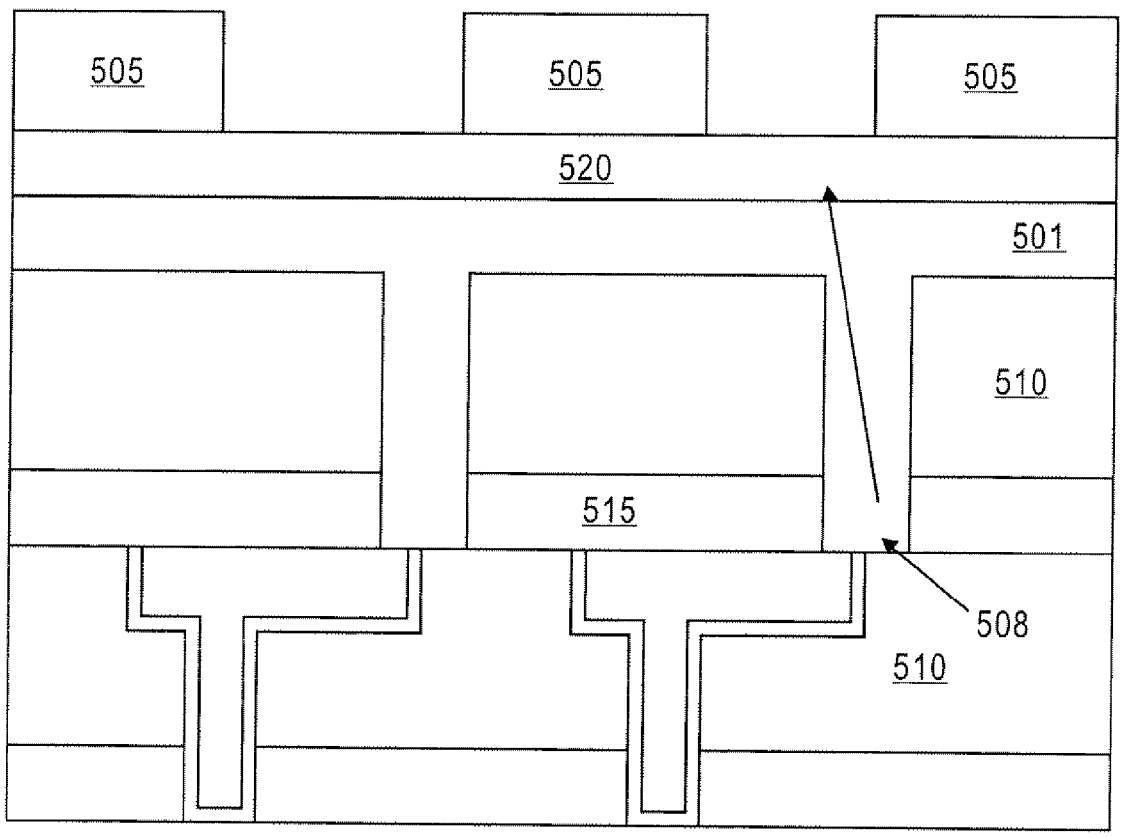
FIG. 5 illustrates one embodiment of the invention, in which a PBL is deposited between the SLAM layer and the photoresist layer.

FIG. 5 illustrates one embodiment of the invention, in which a PBL is deposited between the SLAM layer and the photoresist layer. The semiconductor device illustrated in FIG. 5 includes an etch stop layer 515, an ILD layer 510, a SLAM layer 501, and a photoresist layer 505. By depositing a PBL 520 between the SLAM layer and the photoresist layer, the embodiment illustrated in FIG. 5 can help prevent amines traversing 508 from the ILD through the SLAM layer from coming into contact with the photoresist layer.

In at least one embodiment of the invention the PBL contains any carbon-based polymer that reacts sufficiently with amines to prevent the amines from poisoning the photoresist, including polymer blended compounds, such as poly-t-butyl vinylcarbamate, plyacetaldehyde with polyvinylchloride, and polyorthonovolaks with trichlorotriazine. In other embodiments, other polymers or polymer blended compounds may be used that react with amines. Furthermore, in other embodiments, the PBL layer may be deposited between other materials illustrated in FIG. 5. In other embodiments, the PBL may be integrated with at least one material illustrated in FIG. 5.

The semiconductor features illustrated in FIG. 5 may be formed as part of a damascene process, in one embodiment of the invention. In other embodiments of the invention, the features of FIG. 5 are formed as part of a dual damascene process. However, embodiments of the invention illustrated in FIGS. 3-5 may be applied to any semiconductor process in which photoresist is applied to a surface which includes an ILD or similar structure.

Diffusion of amines into the photoresist may be further ameliorated by binding the amines to the polymer backbone of the PAG in one embodiment. In one embodiment of the invention, amines can be bound to the polymer backbone by introducing a basic property to the photoresist and linking the base to the polymer backbone. Alternatively or additionally, some embodiments reduce the diffusion of amines into the photoresist by introducing photoactive base compounds, such as photo-decomposable bases (PDBs) and photo-generated bases (PGBs), to the SLAM/photoresist interface.

Figure 6:
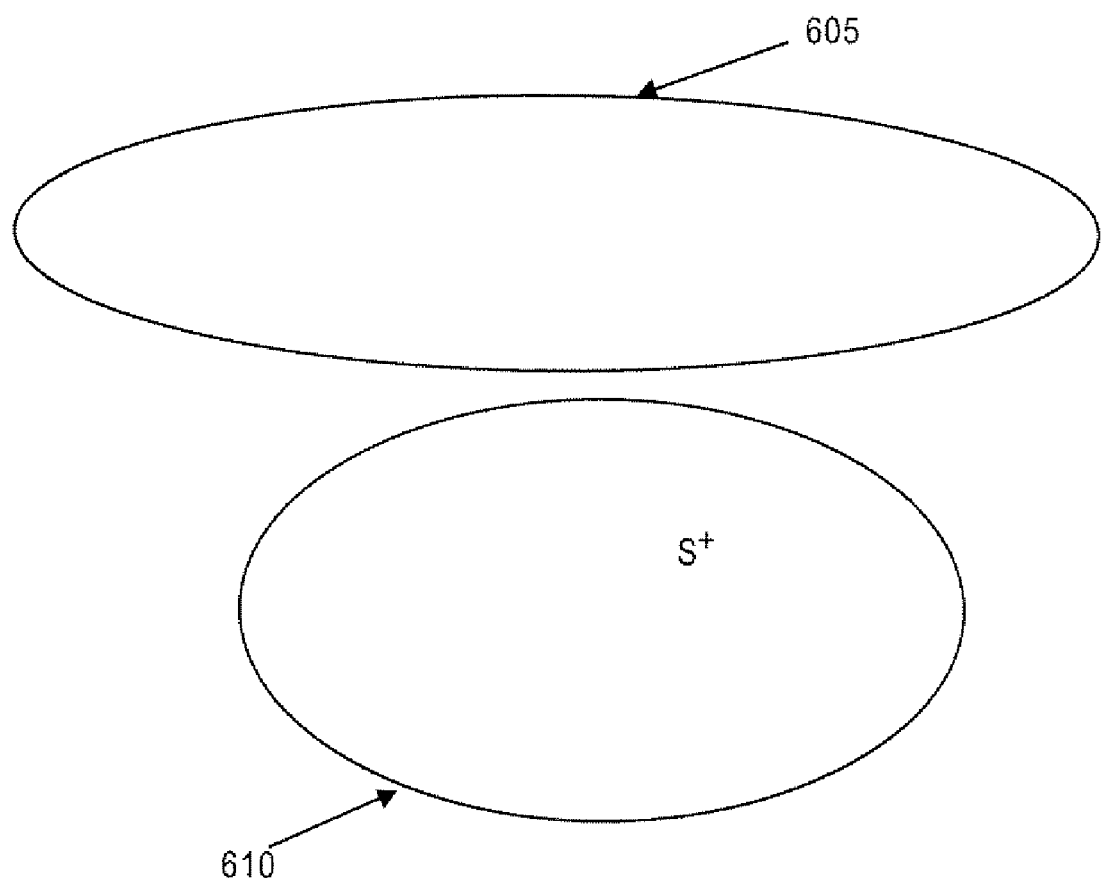
FIG. 6 illustrates a SLAM having a sulfonium PAG covalently attached thereto, according to one embodiment of the invention.
Figure 7:
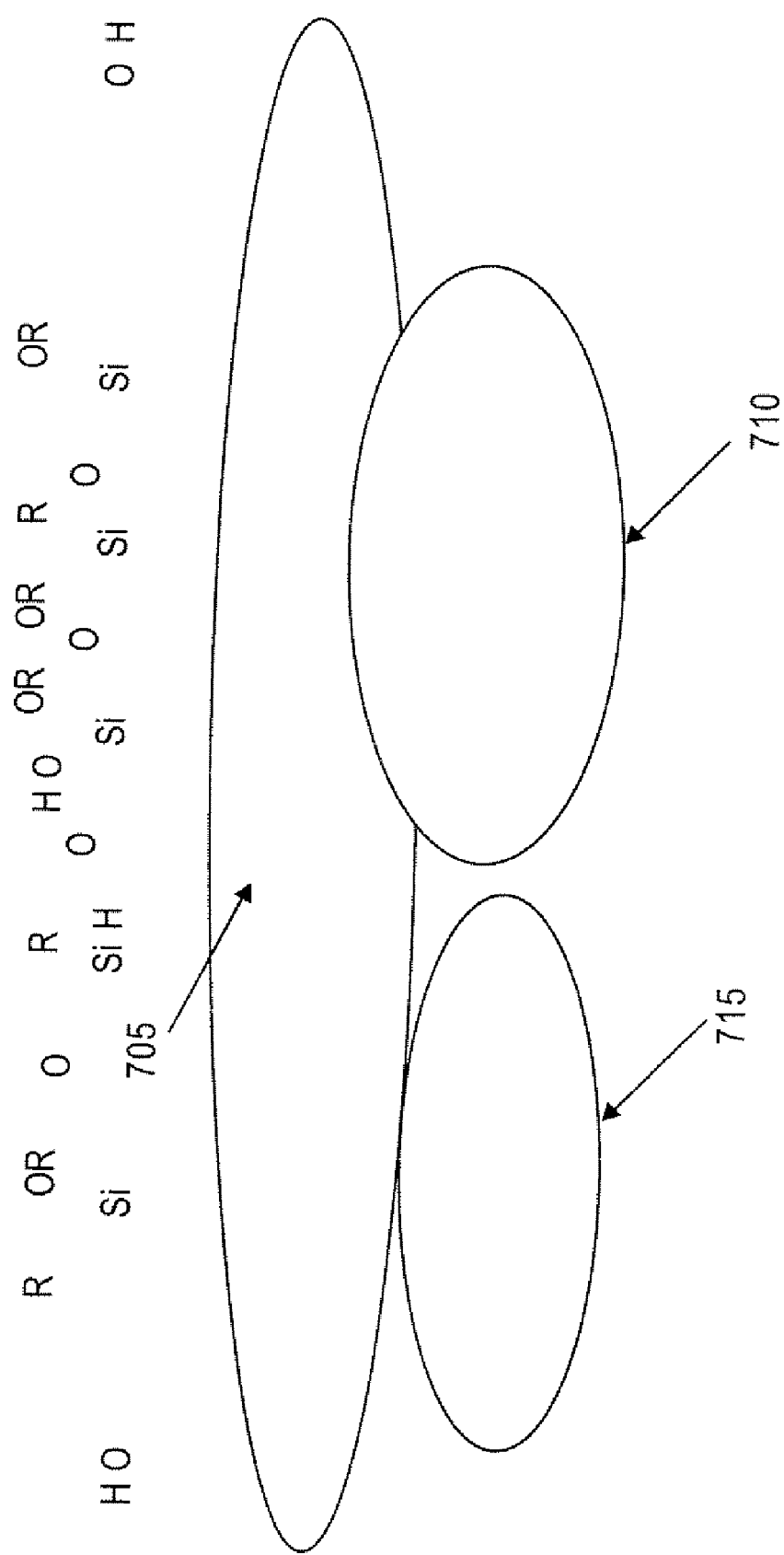
FIG. 7, on the other hand, illustrates a non-ionic PAG having a base quenching compound attached thereto.
Figure 8:
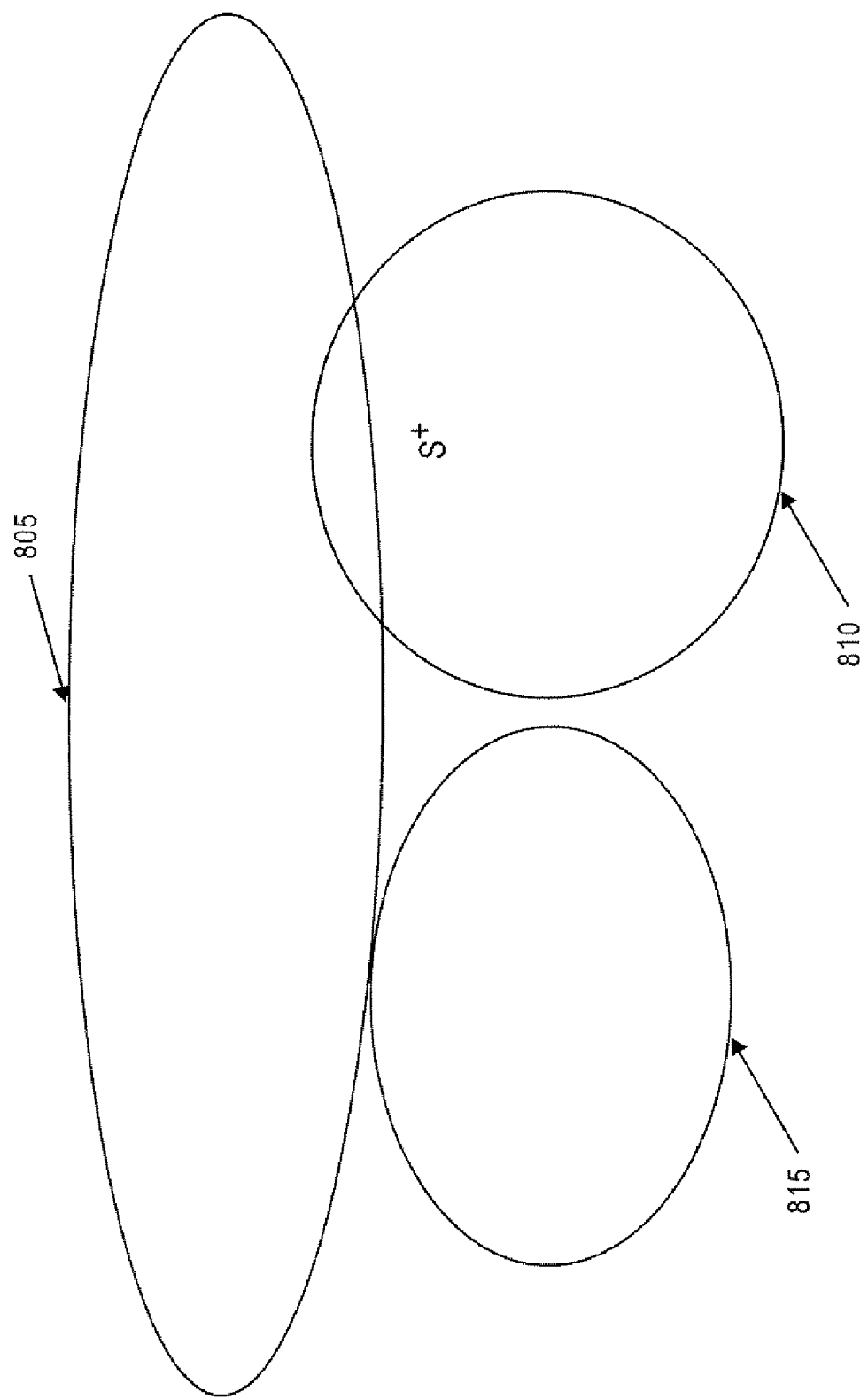
FIG. 8 further illustrates a SLAM having sulfonium hydroxide covalently attached thereto.

Introducing PDBs, such as sulfonium hydroxides, to the SLAM/photoresist interface can increase the pH contrast between exposed and unexposed regions of the interface, in one embodiment, whereas introducing PGBs, such as quaternary ammonium dithiocarbamate and/or alpha-keto carbamate, would decrease the pH contrast between the exposed and unexposed regions. By way of example, FIG. 6 illustrates a SLAM 605 having a sulfonium PAG 610 covalently attached thereto, according to one embodiment of the invention. FIG. 7, on the other hand, illustrates a SLAM 705 coupled to a non-ionic PAG 710 and a base quenching compound 715 attached thereto. FIG. 8 further illustrates a SLAM 805 having a PAG 810 and a sulfonium hydroxide PDB 815 covalently attached thereto. Moreover, other ionic and non-ionic PAGs could be used in the examples illustrated in FIGS. 6-8 in other embodiments of the invention.

Various materials may be used in the embodiments of the invention. For example, the substrate surface may be doped silicon, silicon dioxide, carbon doped silicon dioxide (CDO) or other substrate materials. The compounds illustrated in FIGS. 6-8 may be used in a damascene process, in one embodiment of the invention. In other embodiments of the invention, the compounds of FIGS. 6-8 are used as part of a dual damascene process. However, embodiments of the invention illustrated in FIG. 6-8 may be applied to any semiconductor process that includes SLAM and photoresist deposition.

While the invention has been described with reference to illustrative embodiments, this description is not intended to be construed in a limiting sense. Various modifications of the illustrative embodiments, as well as other embodiments, which are apparent to persons skilled in the art to which the invention pertains are deemed to lie within the spirit and scope of the invention.

What is claimed is:

1. A semiconductor process comprising:
   forming an etch stop layer;
   forming an ILD superjacent to the etch stop layer;
   etching a trench within the etch stop layer and the ILD;
   depositing a sacrificial light absorbing material (SLAM) within the trench, the SLAM comprising a photoactive generator (PAG);
   forming a poison barrier layer (PBL) superjacent to the SLAM;
   applying a photoresist layer superjacent to the PBL;
   exposing a portion of the photoresist to incident light;
   a bake operation, during which amines are generated; and
   wherein the PBL comprises a compound blend chosen from a group consisting of: poly-t-butyl vinylcarbamate, polyacetaldehyde with polyvinylchloride, and polyorthonovolaks with trichlorotriazine.

2. The process of claim 1 wherein SLAM comprises either a photo decomposable base (PDB) or a photo generated base (PGB) to neutralize amines generated by bonding the PAG with the SLAM.

3. The process of claim 2 wherein the PBL helps to prevent amines generated during the bake operation from reacting with the photoresist layer.

4. The process of claim 3 comprising a dual damascene process.

5. The process of claim 4 wherein the PAG bonds to the photoresist via a chemical catalyst group comprising nonafluorobutanesulfonate.

6. The process of claim 5 wherein the PAG is coupled to a photon harvesting group to enhance solubility of the photoresist, the photon harvesting group comprising methyldiphenylsulfonium.

7. The process of claim 1, wherein the SLAM material is bound to the PAG by a reaction between trialkoxysilane within the PAG and Si—OH groups within the SLAM material.

8. The process of claim 1, wherein the SLAM material is bound to the PAG via covalent bonds.

9. The process of claim 1, wherein the PAG comprises a monomer chosen from the group consisting of (3-diphenylsulfoniumpropyl) trimethoxysilane trifluoromethanesulfonate, (3-diphenylsulfoniumpropyl) trimethoxysilane nonafluorobutanesulfonate, and (3-diphenylsulfoniumpropyl) trimethoxysilane iodide.

* * * * *